United States Patent
Fukunaga

(10) Patent No.: US 8,564,013 B2
(45) Date of Patent: Oct. 22, 2013

(54) LIGHT-EMITTING THYRISTOR, LIGHT SOURCE HEAD, AND IMAGE FORMING APPARATUS

(75) Inventor: Hideki Fukunaga, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 171 days.

(21) Appl. No.: 13/189,943

(22) Filed: Jul. 25, 2011

(65) Prior Publication Data
US 2012/0242771 A1    Sep. 27, 2012

(30) Foreign Application Priority Data
Mar. 25, 2011   (JP) .................................. 2011-068826

(51) Int. Cl.
H01L 33/00    (2010.01)

(52) U.S. Cl.
USPC ................................ 257/102; 257/79; 438/22

(58) Field of Classification Search
USPC ........................................................ 257/102
See application file for complete search history.

(56) References Cited

U.S. PATENT DOCUMENTS

| 6,825,500 B1 | 11/2004 | Komaba |
| 7,009,221 B2 | 3/2006 | Ohno |
| 2004/0196708 A1 | 10/2004 | Ohno |
| 2007/0075330 A1 * | 4/2007 | Ogihara et al. ............... 257/134 |
| 2009/0297223 A1 * | 12/2009 | Suzuki .......................... 399/221 |

FOREIGN PATENT DOCUMENTS

| JP | A-8-153890 | 6/1996 |
| JP | A-2001-68726 | 3/2001 |
| JP | A-2005-340471 | 12/2005 |
| JP | 2007180460 A * | 7/2007 |

* cited by examiner

Primary Examiner — Ajay K Arora
(74) Attorney, Agent, or Firm — Oliff & Berridge, PLC

(57) ABSTRACT

A light-emitting thyristor includes a substrate, a first semiconductor multi-layered mirror of a first conductivity type that is formed on the substrate, a gate layer that is formed on the first semiconductor multi-layered mirror by stacking a plurality of semiconductor light-emitting layers having different peak values of an emission wavelength, and a second semiconductor multi-layered mirror of a second conductivity type that is formed on the gate layer.

9 Claims, 11 Drawing Sheets

FIG. 6

| LAYER | AI COMPOSITION | | THICKNESS (nm) | DOPANT |
|---|---|---|---|---|
| n-GaAs CONTACT LAYER | 0 | | 25 | Si |
| n-AlGaAs CATHODE LAYER | 0.16 | | 30 | Si |
| n-DBR LAYER | 0.86 | 4 PAIRS STACKED | $\lambda/4$ | Si |
|  | 0.16 |  | $\lambda/4$ | Si |
| n-AlGaAs CATHODE LAYER | 0.86 | | $\lambda/4$ | Si |
| p-AlGaAs LIGHT-EMITTING LAYER | 0.14 | | $2\lambda$ | Zn |
| n-AlGaAs LIGHT-EMITTING LAYER | 0.12 | | $\lambda$ | Si |
| p-DBR LAYER | 0.86 | 10 PAIRS STACKED | $\lambda/4$ | Zn |
|  | 0.16 |  | $\lambda/4$ | Zn |
| p-GaAs BUFFER LAYER | 0 | | 50 | Zn |
| p-GaAs SUBSTRATE | 0 | | — | — |

FIG. 8

| LAYER | | Al COMPOSITION | THICKNESS (nm) | DOPANT |
|---|---|---|---|---|
| n-GaAs CONTACT LAYER | | 0 | 25 | Si |
| n-AlGaAs CATHODE LAYER | | 0.16 | 30 | Si |
| n-DBR LAYER | 4 PAIRS STACKED | 0.86 | λ/4 | Si |
| | | 0.16 | λ/4 | Si |
| n-AlGaAs CATHODE LAYER | | 0.86 | λ/4 | Si |
| p-AlGaAs LIGHT-EMITTING LAYER | | 0.12 | λ/2 | Zn |
| p-AlGaAs LIGHT-EMITTING LAYER | | 0.14 | λ | Zn |
| n-AlGaAs LIGHT-EMITTING LAYER | | 0.14 | λ | Si |
| n-AlGaAs LIGHT-EMITTING LAYER | | 0.12 | λ/2 | Si |
| p-DBR LAYER | 10 PAIRS STACKED | 0.86 | λ/4 | Zn |
| | | 0.16 | λ/4 | Zn |
| p-GaAs BUFFER LAYER | | 0 | 50 | Zn |
| p-GaAs SUBSTRATE | | 0 | — | — |

FIG. 9

| LAYER | | Al COMPOSITION | THICKNESS (nm) | DOPANT |
|---|---|---|---|---|
| n-GaAs CONTACT LAYER | | 0 | 25 | Si |
| n-AlGaAs CATHODE LAYER | | 0.30 | 30 | Si |
| n-DBR LAYER | 4 PAIRS STACKED | 0.86 | λ/4 | Si |
| | | 0.30 | λ/4 | Si |
| n-AlGaAs CATHODE LAYER | | 0.86 | λ/4 | Si |
| p-AlGaAs GATE LAYER | | 0.25 | λ/2 | Zn |
| p-AlGaAs LIGHT-EMITTING LAYER | | 0.12 | λ/2 | Zn |
| p-AlGaAs GATE LAYER | | 0.25 | λ/2 | Zn |
| n-AlGaAs GATE LAYER | | 0.14 | λ/2 | Si |
| n-AlGaAs GATE LAYER | | 0.25 | 3λ/2 | Si |
| p-DBR LAYER | 10 PAIRS STACKED | 0.86 | λ/4 | Zn |
| | | 0.30 | λ/4 | Zn |
| p-GaAs BUFFER LAYER | | 0 | 50 | Zn |
| p-GaAs SUBSTRATE | | 0 | — | — |

LIGHT-EMITTING THYRISTOR, LIGHT SOURCE HEAD, AND IMAGE FORMING APPARATUS

CROSS-REFERENCE TO RELATED APPLICATIONS

This application is based on and claims priority under 35 USC 119 from Japanese Patent Application No. 2011-068826 filed Mar. 25, 2011.

BACKGROUND

Technical Field

The present invention relates to a light-emitting thyristor, a light source head, and an image forming apparatus.

SUMMARY

According to an aspect of the invention, there is provided a light-emitting thyristor including a substrate, a first semiconductor multi-layered mirror of a first conductivity type that is formed on the substrate, a gate layer that is formed on the first semiconductor multi-layered mirror by stacking plural semiconductor light-emitting layers having different peak values of an emission wavelength, and a second semiconductor multi-layered mirror of a second conductivity type that is formed on the gate layer.

BRIEF DESCRIPTION OF THE DRAWINGS

Exemplary embodiments of the present invention will be described in detail based on the following figures, wherein:

FIG. 6 is a diagram illustrating a specific example of Al compositions and thicknesses of layers of a light-emitting thyristor according to Example 1 of the exemplary embodiment;

FIG. 8 is a diagram illustrating a specific example of Al compositions and thicknesses of layers of a light-emitting thyristor according to Example 2 of the exemplary embodiment;

FIG. 9 is a diagram illustrating a specific example of Al compositions and thicknesses of layers of a light-emitting thyristor according to Example 3 of the exemplary embodiment;

DETAILED DESCRIPTION

Hereinafter, examples of an exemplary embodiment of the invention will be described in detail with reference to the accompanying drawings.

Figure 1:
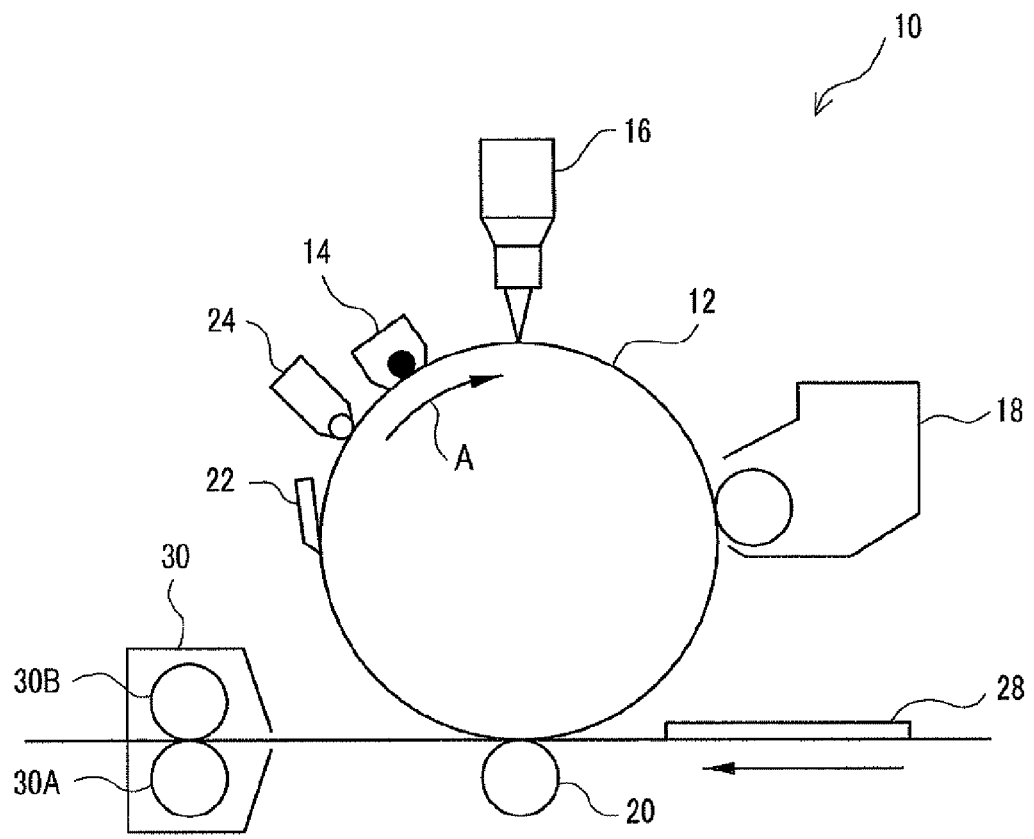
FIG. 1 is a diagram schematically illustrating the configuration of an image forming apparatus according to an exemplary embodiment of the invention.
Figure 2:
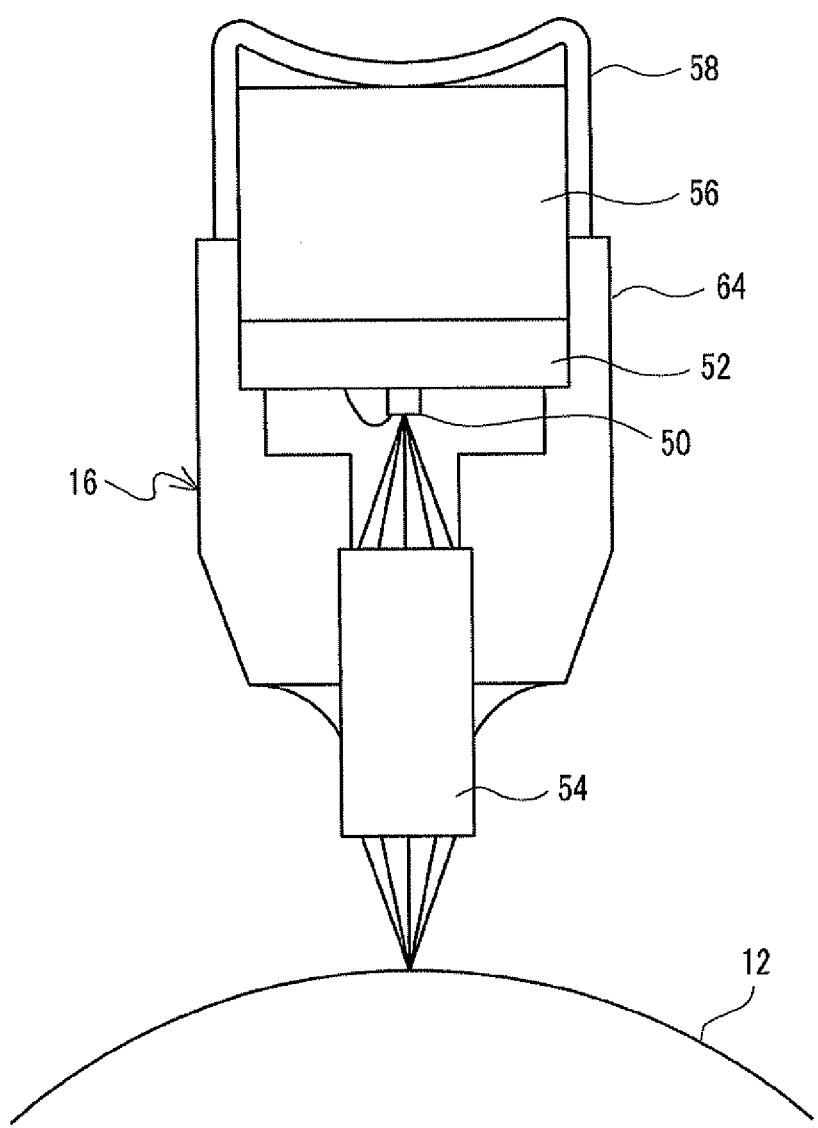
FIG. 2 is an enlarged sectional view schematically illustrating the internal configuration of a printer head according to the exemplary embodiment.
Figure 3:
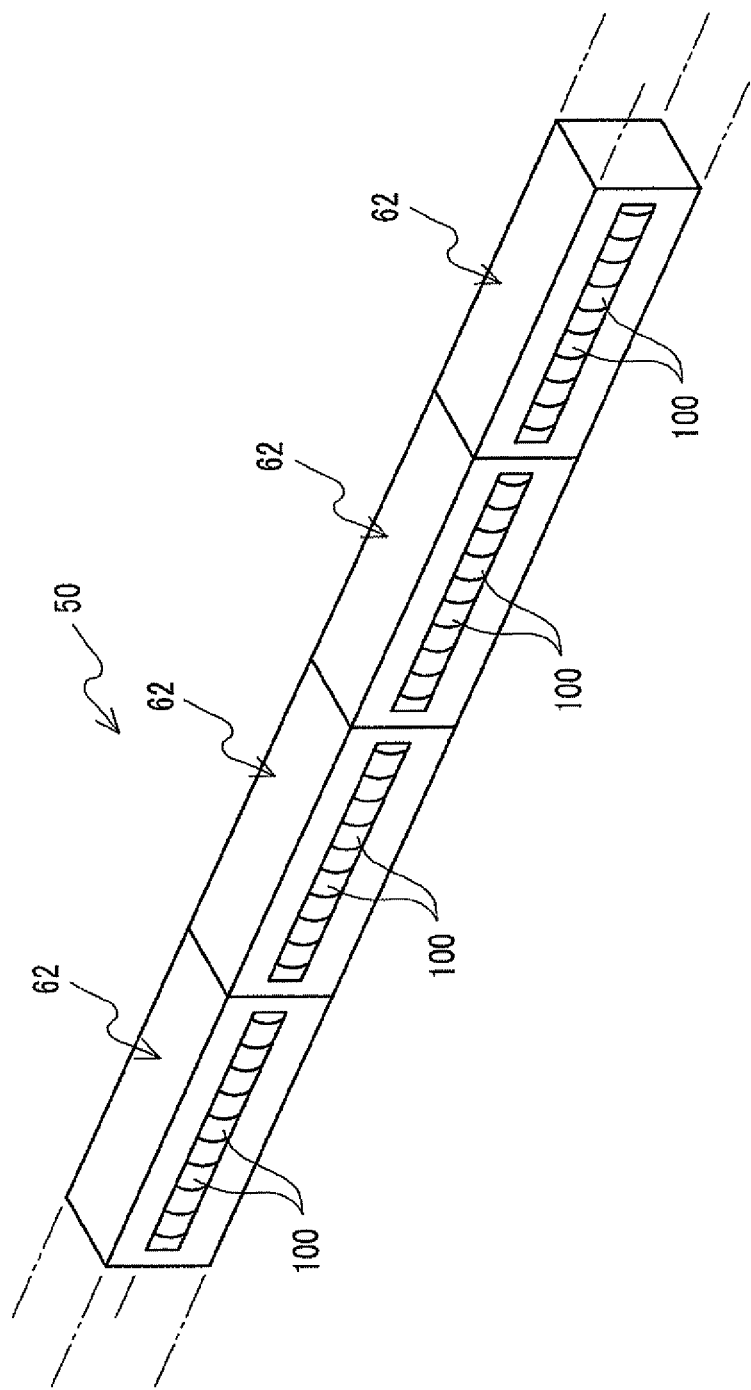
FIG. 3 is a perspective view illustrating the appearance of a light-emitting thyristor array according to the exemplary embodiment.
Figure 4:
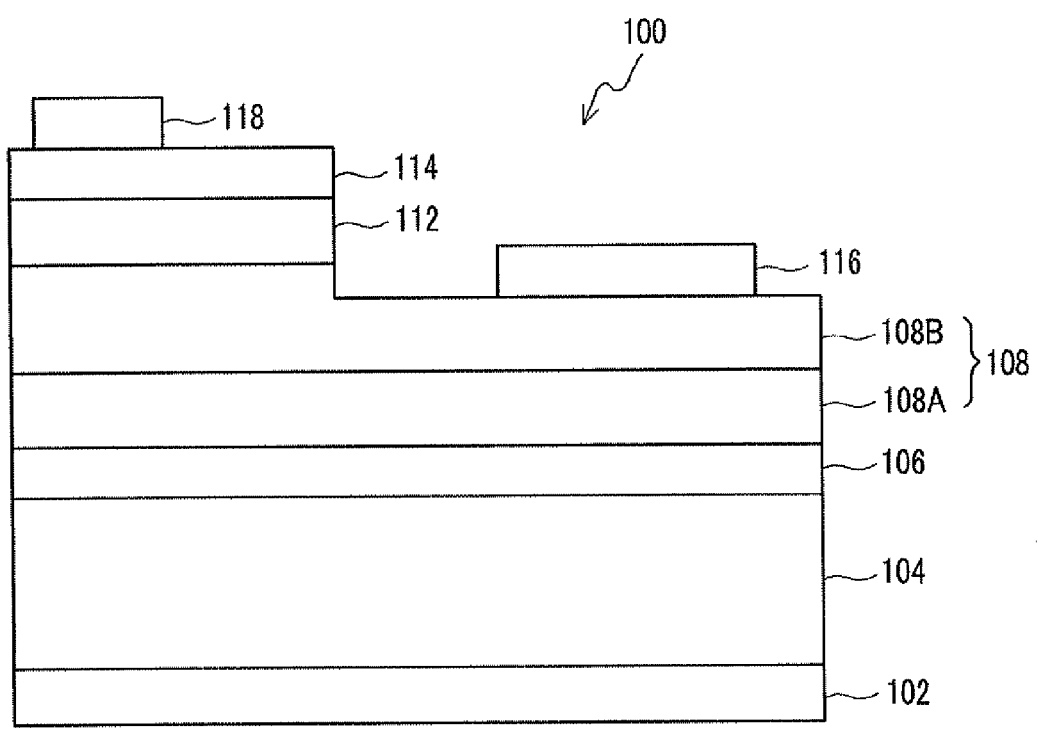
FIG. 4 is a sectional view schematically illustrating a light-emitting thyristor according to the exemplary embodiment.

FIG. 1 is a diagram schematically illustrating the configuration of an image forming apparatus according to an exemplary embodiment of the invention. FIG. 2 is a sectional view schematically illustrating the internal configuration of a light source head according to the exemplary embodiment. FIG. 3 is a perspective view illustrating the appearance of a light-emitting thyristor array according to the exemplary embodiment. FIG. 4 is a sectional view schematically illustrating a light-emitting thyristor according to the exemplary embodiment.

The image forming apparatus 10 according to the exemplary embodiment of the invention includes a photosensitive member 12 rotating at a constant speed in the direction of arrow A, as shown in FIG. 1.

Around the photosensitive member 12, a charging device 14 that charges the surface of the photosensitive member 12, a light source head 16 (the exposing unit) that exposes the surface of the photosensitive member 12 charged by the charging device 14 so as to form an electrostatic latent image on the surface of the photosensitive member 12, a developing device 18 (the developing unit) that develops the electrostatic latent image with a developer so as to form a toner image, a transfer member 20 (the transfer unit) that transfers the toner image onto a sheet of paper 28 (the recording medium), a cleaner 22 that removes toner remaining on the photosensitive member 12 after the transfer, and an erasing lamp 24 that removes the electricity of the photosensitive member 12 to homogenize the potential are sequentially arranged in the rotating direction of the photosensitive member 12.

That is, the surface of the photosensitive member 12 is charged by the charging device 14 and then a light beam is applied thereto by the light source head 16 to form an electrostatic latent image on the photosensitive member 12. The light source head 16 is connected to a driving unit (not shown) and the lighting of a light-emitting thyristor 100 is controlled by the driving unit so as to emit a light beam on the basis of image data.

The electrostatic latent image is developed with toner by the developing device 18 to form a toner image on the photosensitive member 12. The toner image on the photosensitive member 12 is transferred onto a carried sheet of paper 28 by the transfer member 20. The toner remaining on the photosensitive member 12 after the transfer is removed by the cleaner 22, the residual charge on the surface of the photosensitive member 12 is erased by the erasing lamp 24, the photosensitive member 12 is charged again by the charging device 14, and the same processes are repeatedly performed.

Meanwhile, the sheet of paper 28 onto which the toner image is transferred is carried to a fixing device 30 (the fixing unit) including a pressing roller 30A and a heating roller 30B and is subjected to a fixing process. Accordingly, the toner image is fixed to form a desired image on the sheet of paper 28. The sheet of paper 28 on which an image is formed is discharged from the apparatus.

The configuration of the light source head 16 according to this exemplary embodiment will be described in detail below. The light source head 16 according to this exemplary embodiment employs a self-scanning LED (SLED). An SLED has a structure in which an LED array and a driving part thereof are formed in a body and includes a light-emitting part (the light-emitting thyristor 100 of which the details will be described later) having plural thyristor structures. As shown in FIG. 2, the light source head 16 includes a light-emitting thyristor array 50, a mounting board 52 supporting the light-emitting thyristor array 50 and being mounted with a circuit (not shown) supplying various signals for controlling the driving of the light-emitting thyristor array 50, and a rod lens array 54 such as a Selfoc lens array (Selfoc is a registered trademark of Nippon Sheet Glass Co., Ltd.).

A mounting board 52 is disposed in a housing 56 with the mounting surface of the light-emitting thyristor array 50 opposed to the photosensitive member 12 and is supported by a leaf spring 58.

As shown in FIG. 3, in the light-emitting thyristor array 50, plural chips 62, in each of which plural light-emitting thyristors 100 are arranged, are arranged in series along the axis direction of the photosensitive member 12 depending on the resolution in the axis direction, and a light beam is applied in the axis direction of the photosensitive member 12 with a predetermined resolution.

In this exemplary embodiment, plural chips 62 are arranged in series in a one-dimensional shape, but the invention is not limited to this arrangement and may be divided into plural columns to be arranged in a two-dimensional shape. For example, when they are arranged in a zigzag shape, the plural chips 62 are arranged in a line along the axis direction of the photosensitive member 12 and are shifted in a direction intersecting the axis direction with a constant gap and arranged in two lines. Even when the chips 62 are divided into plural units, the plural light-emitting thyristors 100 are arranged so that the gap between two adjacent light-emitting thyristors 100 in the axis direction of the photosensitive member 12 is almost constant.

As shown in FIG. 2, the rod lens array 54 is supported by a holder 64 and focuses the light beams emitted from the light-emitting thyristors 100 on the photosensitive member 12.

The light-emitting thyristor 100 according to this exemplary embodiment will be described below.

The schematic configuration of the light-emitting thyristor 100 according to this exemplary embodiment will be described with reference to FIG. 4. The light-emitting thyristor 100 according to this exemplary embodiment includes a p-type GaAs substrate 104 and a p-type AlGaAs-based anode layer 106, a gate layer 108 including an n-type AlGaAs-based gate layer 108A and a p-type AlGaAs-based gate layer 108B, an n-type AlGaAs-based cathode layer 112, and an n-type GaAs-based contact layer 114 which are sequentially stacked on the p-type GaAs substrate 104.

The light-emitting thyristor 100 includes an anode electrode 102, a gate electrode 116, and a cathode electrode 118. The anode electrode 102 is disposed on the back surface (a surface on which the resonator is not formed) of the p-type GaAs substrate 104. The gate electrode 116 is disposed in an area in which the p-type AlGaAs-based gate layer 108B has a thickness smaller than the other area thereof. Meanwhile, the cathode electrode 118 is disposed on the n-type AlGaAs-based cathode layer 112 and the n-type GaAs-based contact layer 114 sequentially stacked in the area other than the area in which the p-type AlGaAs-based gate layer 108B has a smaller thickness.

The anode electrode 102, the gate electrode 116, and the cathode electrode 118 are formed of materials capable of suitably maintaining excellent ohmic contact with the contacted semiconductor layer or the p-type GaAs substrate 104. Specific examples thereof include gold (Au), an alloy (AuGe) of gold and germanium, an alloy (AuZn) of gold and zinc, and nickel (Ni).

In the light-emitting thyristor 100 according to this exemplary embodiment, the band gaps of the n-type AlGaAs-based cathode layer 112 and the p-type AlGaAs-based anode layer 106 are large, and the anode electrode 102 and the cathode electrode 118 are electrically connected to each other by applying a signal (voltage) to the gate electrode 116 so as to allow gate current to flow from the gate electrode 116 to the cathode electrode 118. Accordingly, the layers of the gate layer 108 which amounts to a cavity (resonator) having a band gap smaller than that of the n-type AlGaAs-based cathode layer 112 and the p-type AlGaAs-based anode layer 106 serve as light-emitting layers, carriers (electrons and holes) are recombined in the light-emitting layers, and the light emitted at this time is emitted via the uppermost layer (the n-type GaAs-based contact layer 114).

Figure 10:
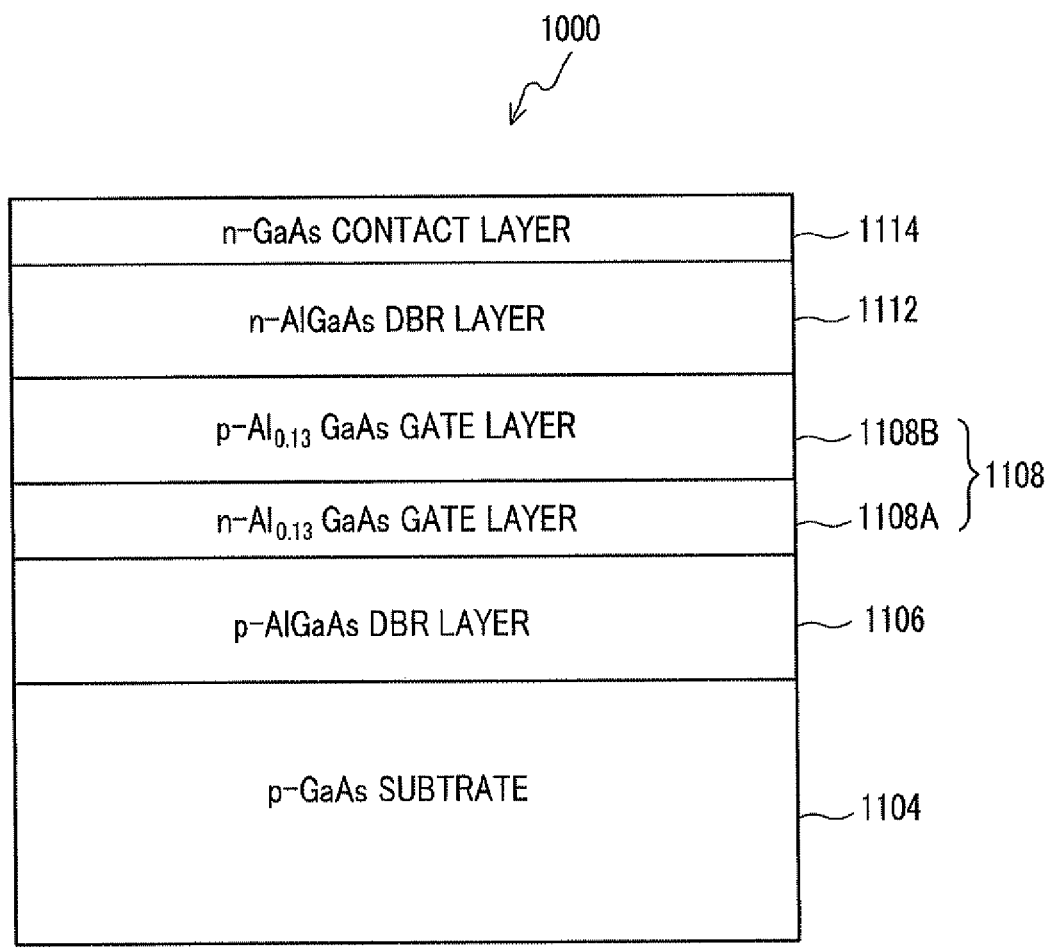
FIG. 10 is a diagram schematically illustrating a partial structure of a light-emitting thyristor according to the related art.

Examples of the structure of the light-emitting thyristor 100 will be described below in detail with reference to the drawings. First, the structure of the light-emitting thyristor 1000 according to the related art will be described for the purpose of comparison with the light-emitting thyristor 100 according to this exemplary embodiment. FIG. 10 schematically illustrates the structure of the light-emitting thyristor 1000 according to the related art.

The light-emitting thyristor 1000 according to the related art has a structure in which a p-type GaAs substrate 1104, a p-type AlGaAs-based DBR (Distributed Bragg Reflector) layer 1106 serving as an anode layer, an n-type AlGaAs-based gate layer 1108A, a p-type AlGaAs-based gate layer 1108B, an n-type AlGaAs-based DBR layer 1112 serving as a cathode layer, and an n-type GaAs-based contact layer 1114 are sequentially stacked on a p-type GaAs substrate 1104. In this way, by using the anode layer 1106 and the cathode layer 1112 as DBR mirrors and using the n-type AlGaAs-based gate layer 1108A and the p-type AlGaAs-based gate layer 1108B as a resonator (cavity), an RC (Resonant Cavity) is implemented.

In the light-emitting thyristor 1000 according to the related art, by setting the Al compositions of the n-type AlGaAs-based gate layer 1108A and the p-type AlGaAs-based gate layer 1108B to 0.13, light with a peak wavelength of 780 nm is generated in the n-type AlGaAs-based gate layer 1108A and the p-type AlGaAs-based gate layer 1108B. In the RC structure, by setting the thickness of a layer of the DBR mirror to $780/(4n)$ nm and setting the length of the resonator to an integral multiple of $780/(2n)$ nm, light with a peak wavelength of 780 nm is emitted. Here, n represents the refractive index of AlGaAs in the DBR mirror or the resonator with respect to light of 780 nm.

Figure 11:
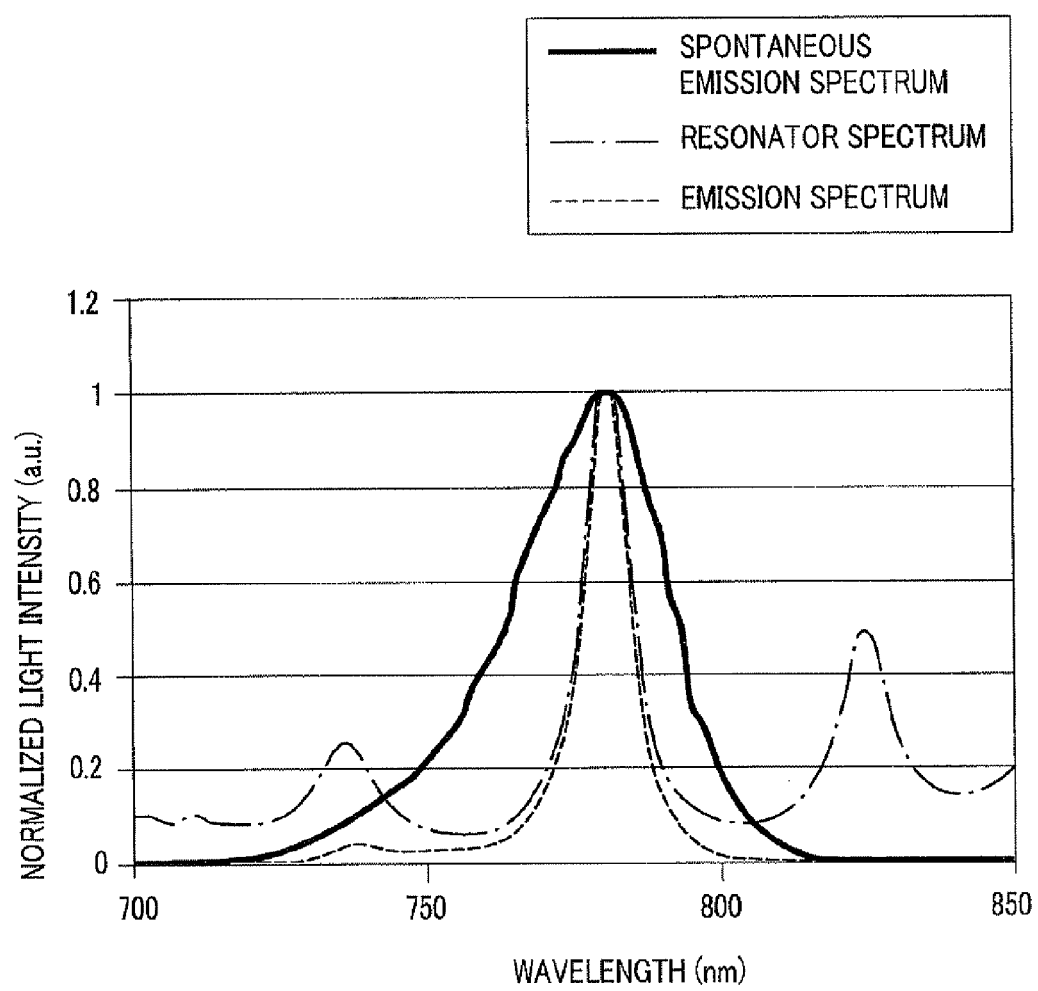
FIG. 11 is a diagram illustrating a specific example of the relationship of wavelength and light intensity among a spontaneous emission spectrum, a resonator spectrum, and an emission spectrum in the light-emitting thyristor according to the related art.

In general, in a light-emitting thyristor having an RC structure, the combination of a spontaneous emission spectrum in the gate layer and a resonator spectrum generated by the RC structure serves as an emission spectrum emitted to the outside. A specific example of the relationship between wavelength and light intensity in the spontaneous emission spectrum, the resonator spectrum, and the emission spectrum in the light-emitting thyristor 1000 according to the related art is shown in FIG. 11.

In the spontaneous emission spectrum, the peak wavelength is shifted due to the variation in temperature. Specifically, when the temperature rises, the peak wavelength is shifted to the long wavelength side (to the right in FIG. 11).

This will be described specifically. In an $Al_xGa_{(1-x)}As$-based light-emitting thyristor, the Al composition x, the band gap energy Eg (of which the unit is eV), and the wavelength λ (of which the unit is nm) satisfy Expressions 1 and 2.

$$Eg(x)=1.424+1.247 \times x (x<0.45) \quad \text{Expression 1}$$

$$\lambda=1240/Eg \quad \text{Expression 2}$$

The shift amount Δλ of the spontaneous emission spectrum due to the variation in wavelength λ with temperature is approximated to Expression 3.

$$\Delta\lambda=0.24 \text{ nm/°C} \quad \text{Expression 3}$$

Regarding light with a wavelength λ of 780.0 nm at 20° C., the wavelength is shifted at 40° C. by Δλ=0.24×(40−20)=4.8 nm based on Expression 3 and the wavelength becomes 784.8 nm (=780+0.24×(40−20)).

In the light-emitting thyristor 1000 according to the related art, as shown in FIG. 11, when the spontaneous emission spectrum is shifted due to the variation in temperature as described above, the peak of the spontaneous emission spectrum is separated from the peak of the resonator spectrum. Accordingly, the emission spectrum varies greatly and the light intensity is reduced. That is, a problem in which the intensity of light emitted from the light-emitting thyristor 1000 varies greatly due to the variation in temperature is caused.

Example 1

Figure 5:
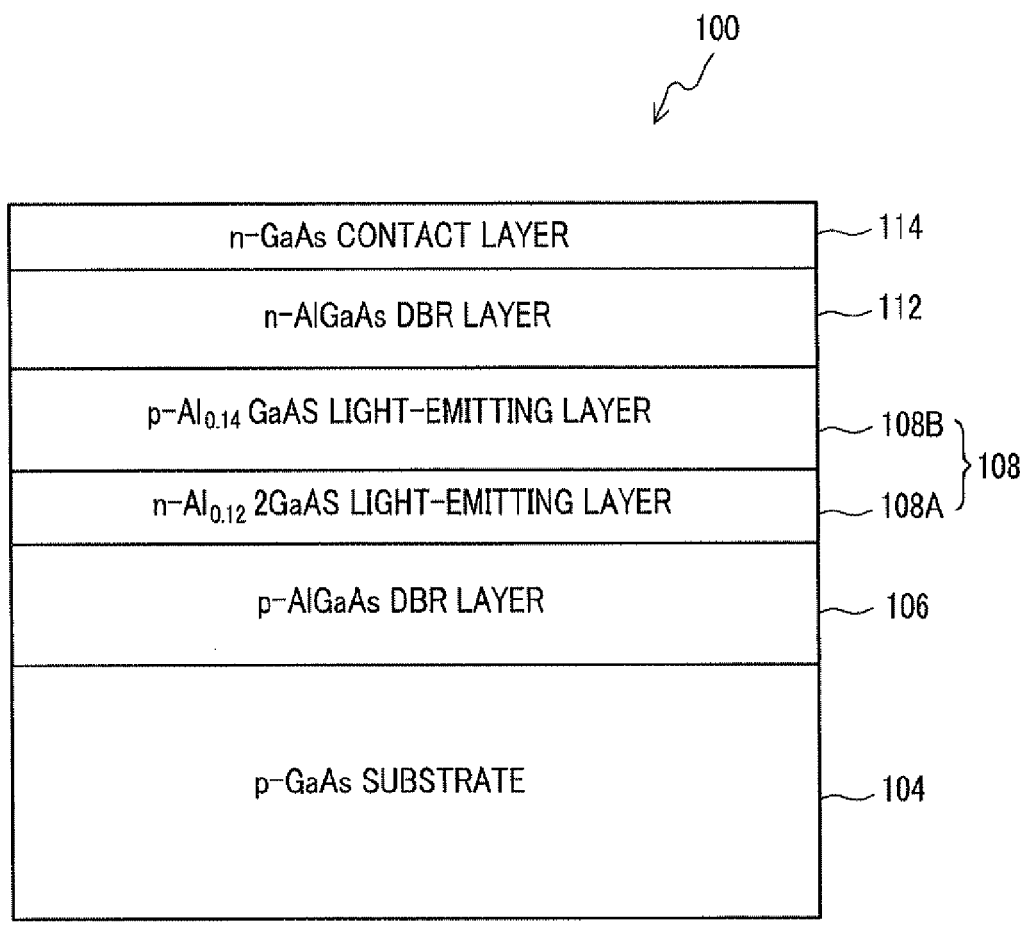
FIG. 5 is a diagram schematically illustrating a partial structure of the light-emitting thyristor according to the exemplary embodiment.

The structure of the light-emitting thyristor 100 according to this exemplary embodiment will be described below. FIG. 5 schematically illustrates the structure of the light-emitting thyristor 100 according to Example 1 of this exemplary embodiment.

The light-emitting thyristor 100 according to this example has a structure in which a p-type GaAs substrate 104, a p-type AlGaAs-based DBR layer 106 as an anode layer, a gate layer 108 including an n-type $Al_{0.12}GaAs$-based light-emitting layer 108A and a p-type $Al_{0.14}GaAs$-based light-emitting layer 108B, an n-type AlGaAs-based DBR layer 112 as a cathode layer, and an n-type GaAs-based contact layer 114 are stacked. In this way, by using the p-type AlGaAs-based anode layer 106 and the n-type AlGaAs-based cathode layer 112 as the DBR mirrors, using the n-type $Al_{0.12}GaAs$-based light-emitting layer 108A and the p-type $Al_{0.14}GaAs$-based light-emitting layer 108B having different Al compositions, that is, having different peak wavelengths of the spontaneous emission spectrum, as the light-emitting layers of the gate layer 108 serving as a cavity, and setting the reflectance of the n-type AlGaAs-based DBR layer 112 to be slightly lower than the reflectance of the p-type AlGaAs-based DBR layer 106, the RC (Resonant Cavity) structure emitting light from the n-type AlGaAs-based DBR layer 112 side is formed.

FIG. 6 illustrates a specific example of the Al compositions and the thicknesses of the layers of the light-emitting thyristor 100. In FIG. 6, a part of the thickness is represented as an optical thickness relative to the peak wavelength λ. This is because the peak wavelength λ in the semiconductor layer is λ=λ0/n and the resonator length formed in the DBR layer including plural layers having different Al compositions or the gate layer is designed on the basis of the wavelength in the semiconductor layer, where the peak wavelength of light emitted externally from the light-emitting thyristor 100 is λ0 and the refractive index of the semiconductor layer with respect to a light beam propagating in the semiconductor layer with a wavelength of λ0 in the outside is n.

In the light-emitting thyristor 100 according to this exemplary example, for example, Zn is used as the dopant in the case of p-type and Si is used as the dopant in the case of n-type.

The p-type AlGaAs-based DBR layer 106 serving as the anode layer is stacked on the p-type GaAs substrate 104 with a p-type GaAs buffer layer interposed therebetween. Although not shown in FIGS. 4 and 5, the p-type GaAs buffer layer is disposed to improve the crystallization of the p-type GaAs substrate 104 and the anode layer 106 in the light-emitting thyristor 100 according to this example, as shown in FIG. 6.

The p-type AlGaAs-based DBR layer 106 is formed by stacking 10 pairs of an AlGaAs layer with a thickness of λ/4 nm and an Al composition of 0.16 and an AlGaAs layer with a thickness of λ/4 nm and an Al composition of 0.86. Accordingly, the total thickness of the p-type AlGaAs-based DBR layer 106 is 5λ nm and the Al average composition is 0.51.

The n-type AlGaAs-based light-emitting layer 108A is an AlGaAs layer with a thickness of λ/4 nm and an Al composition of 0.12. The wavelength λ of the n-type AlGaAs-based light-emitting layer 108A becomes λ=788.0 nm by Expressions 1 and 2.

The p-type $Al_{0.14}GaAs$-based light-emitting layer 108B is an AlGaAs layer with a thickness of 2λ nm and an Al composition of 0.14. The wavelength λ of the p-type AlGaAs-based light-emitting layer 108B becomes λ=775.7 nm by Expressions 1 and 2.

The cathode layer (DBR layer) 112 includes an n-type AlGaAs-based DBR layer 112 interposed between an AlGaAs-based cathode layer with a thickness of λ/4 nm and an Al composition of 0.86 and an AlGaAs-based cathode layer with a thickness of 30 nm and an Al composition of 0.16. The n-type AlGaAs-based DBR layer 112 is formed by stacking 4 pairs of an AlGaAs layer with a thickness of λ/4 nm and an Al composition of 0.16 and an AlGaAs layer with a thickness of λ/4 nm and an Al composition of 0.86. Accordingly, the total thickness of the n-type AlGaAs-based DBR layer 112 is 2λ nm and the Al average composition is 0.51.

The n-type GaAs-based contact layer 114 has a thickness of 25 nm.

These Al compositions and the thicknesses of the layers are only examples and are not particularly limited as long as they are in the following ranges.

For example, the thicknesses of the n-type AlGaAs-based light-emitting layer 108A and the p-type AlGaAs-based light-emitting layer 108B are integral multiples of λ/2. The total thickness of the gate layer may be such a thickness that current does not flow even when a potential difference (for example, 3 to 5 V) is generated between the gate electrode 116 and the anode electrode 102. Since a part of the p-type AlGaAs-based light-emitting layer 108B may be exposed in the light-emitting thyristor 100 according to this example as shown in FIG. 4, the total thickness of the gate layer is preferably equal to or greater than about 0.1 μm from the viewpoint of precision in manufacturing (film formation).

For example, the optimal range of Al composition may satisfy the layers<the gate layer 108<the cathode layer (the n-type AlGaAs-based DBR layer 112) the anode layer (the p-type AlGaAs-based DBR layer 106) (average value) (the optimal ranges of Al composition of the light-emitting layers 108A and 108B of the gate layer 108 will be described in detail later).

For example, a metal organic chemical vapor deposition (MOCVD) method is used for the crystal growth of the layers of the light-emitting thyristor 100.

As described above, in the light-emitting thyristor 100 having the RC structure in this example, the gate layer 108 interposed between the p-type AlGaAs-based DBR layer 106 as the anode layer and the n-type AlGaAs-based DBR layer 112 as the cathode layer includes two light-emitting layers, which have different peak wavelengths, of the n-type AlGaAs-based light-emitting layer 108A with an Al composition of 0.12 and a peak wavelength of $\lambda=788.0$ nm and the p-type AlGaAs-based light-emitting layer 108B with an Al composition of 0.14 and a peak wavelength of $\lambda=775.7$ nm.

Figure 7:
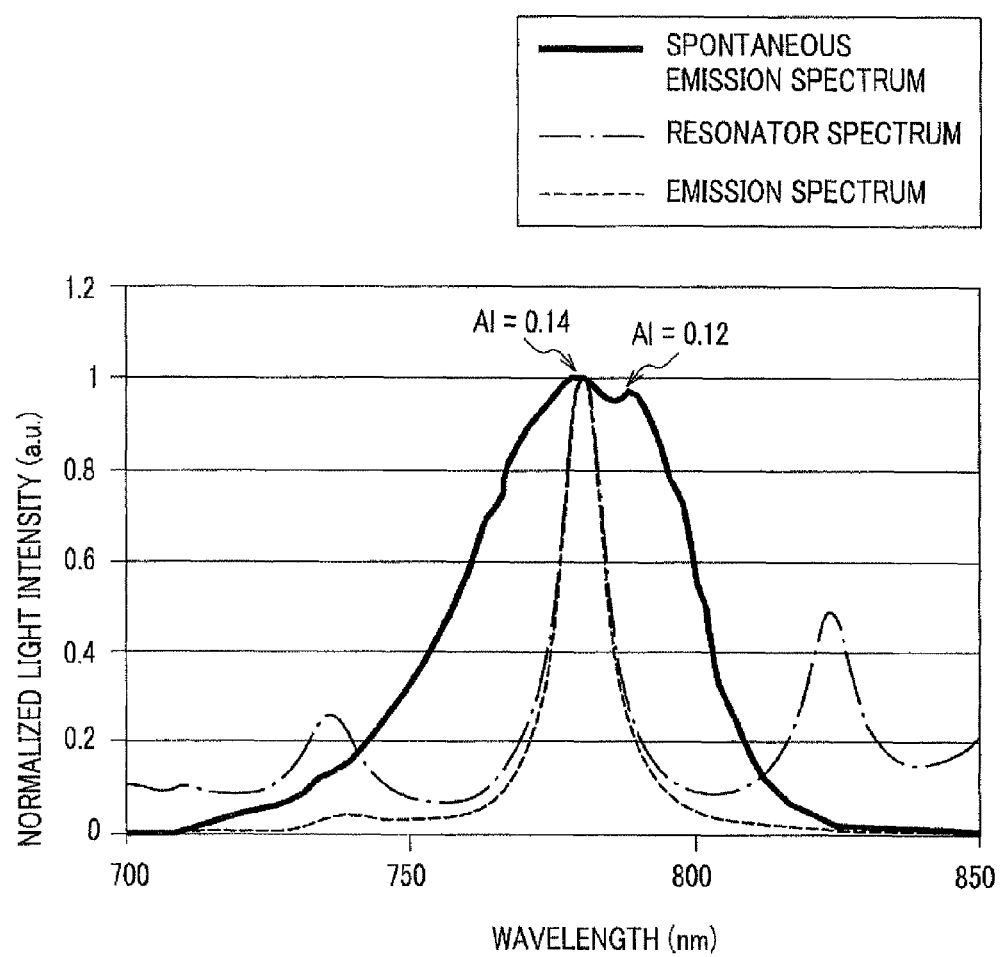
FIG. 7 is a diagram illustrating a specific example of the relationship of wavelength and light intensity among a spontaneous emission spectrum, a resonator spectrum, and an emission spectrum in the light-emitting thyristor according to Example 1 of the exemplary embodiment.

A specific example of the relationship between wavelength and light intensity of a spontaneous emission spectrum, a resonator spectrum, and an emission spectrum in the light-emitting thyristor 100 according to this example is shown in FIG. 7. As shown in FIG. 7, since the combination of the spontaneous emission spectrum of the n-type AlGaAs-based light-emitting layer 108A and the spontaneous emission spectrum of the p-type AlGaAs-based light-emitting layer 108B is the spontaneous emission spectrum of the light-emitting thyristor 100 according to this example, the spontaneous emission spectrum is broad.

Accordingly, as described above, when the peak position of the spontaneous emission spectrum is shifted due to the variation in temperature, the variation in light intensity of the spontaneous emission wavelength at the peak wavelength of the resonator spectrum is slow and thus the variation in intensity of emitted light due to the variation in temperature is suppressed.

When the variation in peak wavelength of the resonator spectrum is caused due to the variations in thickness of the semiconductor layers but the spontaneous emission spectrum is distributed broadly, the variation in light intensity of the emission spectrum is suppressed.

The light-emitting thyristor 100 is not limited to the above-mentioned configuration and composition, and is not particularly limited as long as the gate layer 108 includes plural light-emitting layers having different peak wavelengths. When the light emitting layers are based on AlGaAs as in this example, the gate layer may include plural light-emitting layers having different Al compositions.

In this way, a more preferable range of the Al composition of the light-emitting layers of the gate layer 108 which is based on AlGaAs will be described below. Here, it is assumed that the operating temperature of the light-emitting thyristor 100 is in the range of 20° C. to 60° C. In this case, the spontaneous emission spectrum varies by about 10 nm. When the peak wavelength $\lambda$ of the emitted light spectrum determined by the RC structure is 780 nm and the wavelength does not vary with the variation in temperature, the variation in intensity of the emitted light is suppressed in spite of the variation of the spontaneous emission spectrum due to the variation in temperature, by reducing the variation in intensity of the spontaneous emission spectrum in the wavelength range of 770 nm to 780 nm. Meanwhile, the half-value width of the spontaneous emission spectrum is in the range of 30 nm to 40 nm and the variation in intensity with respect to the wavelength is reduced in the vicinity of the peak of the spontaneous emission spectrum, which is obtained by combining two wavelengths by superimposing the half values of two spectral having different peak wavelengths on each other.

Therefore, the position shifted by 5 nm, which is a half of the wavelength variation range from the half-value position to a long wavelength side at 20° C. is set to 780 nm, and the position shifted by 5 nm from the half-value position to a short wavelength side is set to 780 nm when the peak wavelength is shifted by 10 nm at 40° C. Specifically, the peak wavelength on the short wavelength side is preferably in the range of 750 nm to 760 nm and the wavelength on the long wavelength side is preferably in the range of 790 nm to 810 nm. For example, the representative peak wavelength on the short wavelength side is 760 nm and the representative peak wavelength on the long wavelength side is 790 nm. In this case, the Al composition of the light-emitting layer on the short wavelength side (of which the peak wavelength is $\lambda=760$ nm) is in the range of 0.16 to 0.19 and the Al composition of the light-emitting layer on the long wavelength side (of which the peak wavelength is $\lambda=790$ nm) is in the range of 0.08 to 0.12. The representative Al composition on the short wavelength side is 0.16 and the representative Al composition on the long wavelength side is 0.12.

Here, it is assumed that the wavelength of the emitted light spectrum determined by the RC structure does not vary with the variation in temperature. However, since the optical thickness of the resonator varies due to the variation in refractive index of the semiconductor layer with the variation temperature, the wavelength of the emission spectrum varies in practice. For example, when the temperature rises, the refractive index increases and the optical thickness increases accordingly, whereby the emitted light spectrum is shifted to the long wavelength side. It is predicted that the shift amount of the wavelength is about 0.08 nm/° C. Accordingly, when the light-emitting thyristor is designed to suppress the variation in wavelength, it is preferable that the shift amount should be considered. However, since the variation in emitted light spectrum with the variation in temperature tends to compensate for the decrease in light intensity due to the variation in spontaneous emission spectrum with the variation in temperature, any particular problem is not caused by setting the peak wavelength of the light-emitting layer as described above. In addition, by designing the light-emitting thyristor in consideration of the variation of the emitted light spectrum with temperature, the set position of the peak wavelength is reduced in comparison with the case where the variation in temperature is not considered, and thus the variation in light intensity is suppressed, which is preferable.

For example, the Al compositions of the light-emitting layer 108A and the light-emitting layer 108B may be reversed. The light-emitting layers (the gate layer 108) may be formed out of a non-doped semiconductor layer.

Example 2

In this exemplary embodiment, the gate layer 108 includes the n-type AlGaAs-based light-emitting layer 108A having a single layer and the p-type AlGaAs-based light-emitting layer 108B having a single layer. However, the respective light-emitting layers may include plural layers. An example of this light-emitting thyristor 100 is described as Example 2.

FIG. 8 illustrates a specific example of the Al compositions and the thicknesses of the layers of the light-emitting thyristor 100 according to Example 2. In the light-emitting thyristor 100 of which the structure is shown in FIG. 8, the gate layer has a structure in which an n-type AlGaAs-based light-emitting layer with an Al composition of 0.12, an n-type AlGaAs-based light-emitting layer with an Al composition of 0.14, a p-type AlGaAs-based light-emitting layer with an Al composition of 0.14, and a p-type AlGaAs-based light-emitting layer with an Al composition of 0.12 are stacked sequentially from the substrate side. That is, the gate layer has a structure including plural n-type AlGaAs-based light-emitting layers having different peak wavelengths and plural p-type AlGaAs-based light-emitting layers having different peak wavelengths.

Example 3

In Example 1 and Example 2, the gate layer 108 includes only the light-emitting layers, but the invention is not limited to this configuration and the gate layer may further include a semiconductor layer not serving as a light-emitting layer. This light-emitting thyristor 100 is described as Example 3.

FIG. 9 illustrates a specific example of the Al compositions and the thicknesses of the layers of the light-emitting thyristor 100 according to Example 3. In the light-emitting thyristor 100 of which the structure is shown in FIG. 9, the gate layer has a structure in which an n-type AlGaAs-based gate layer with an Al composition of 0.25, an n-type AlGaAs-based gate layer with an Al composition of 0.14, a p-type AlGaAs-based gate layer with an Al composition of 0.25, a p-type AlGaAs-based gate layer with an Al composition of 0.12, and a p-type AlGaAs-based light-emitting layer with an Al composition of 0.25 are stacked sequentially from the substrate side.

In the gate layer 108 according to this example, the p-type AlGaAs-based light-emitting layer with an Al composition of 0.25 and the n-type AlGaAs-based gate layer with an Al composition of 0.14 serve as a light-emitting layer and emit light. Meanwhile, the n-type AlGaAs-based gate layer with an Al composition of 0.25 and the p-type AlGaAs-based gate layer with an Al composition of 0.25 do not serve as a light-emitting layer and thus do not emit light.

In the gate layer 108 of the light-emitting thyristor 100 described in Example 1 and Example 2, the light-emitting layers having different peak wavelengths are adjacent to each other and the entire gate layer 108 emits light. The light-emitting layers having different peak wavelengths may have different luminous efficiencies. One reason thereof is that carriers flow in a portion easily emitting light in the light-emitting layer. Another reason is that the intensity of the spontaneous emission varies due to the difference in thickness of the light-emitting layers.

In this example, by dividing the gate layer 108 into the light-emitting layers having different Al compositions by the use of a layer having an Al composition greater than those of the light-emitting layers (specifically, by partitioning the layer with an Al composition of 0.12 and the layer with an Al composition of 0.14 by the use of the layer with an Al composition of 0.25), the confinement of carriers may be individually achieved for each light-emitting layer. Therefore, the luminous efficiencies are independently controlled.

In this example, a layer having an Al composition greater than those of the light-emitting layers is interposed between the gate layer 108 and the p-type AlGaAs-based DBR layer 106 as the anode layer and between the n-type AlGaAs-based DBR layer 112 as the cathode layer and the light-emitting layer. Accordingly, it is possible to enhance the luminous efficiency.

In this exemplary embodiment (Examples 1 to 3), the light-emitting thyristor 100 including the p-type GaAs substrate 70 in which the first conductivity type of a pnpn type structure is a p type and the second conductivity type is an n type is described as a specific example, but the invention is not limited to this configuration and a light-emitting thyristor in which the first conductivity type of an npnp type structure is an n type and the second conductivity type is a p type may be implemented.

In this exemplary embodiment (Examples 1 to 3), the light-emitting thyristor 100 using AlGaAs-based materials is described as a specific example, but the invention is not limited to this configuration and a light-emitting thyristor using InGaAsP-based materials, AlGaInP-based materials, InGaN/GaN-based materials, and the like may be implemented.

In this exemplary embodiment, the invention is applied to the light source head 16 of the self-scanning electrophotographic image forming apparatus 10, but the invention is not limited to this configuration and the light-emitting thyristor 100 according to this exemplary embodiment may be applied to another light source head or another image forming apparatus. The light-emitting thyristor 100 may be applied to a light source of other apparatuses such as a scanner.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting thyristor comprising:
   a substrate;
   a first semiconductor multi-layered mirror of a first conductivity type that is formed on the substrate;
   a gate layer that is formed on the first semiconductor multi-layered mirror by stacking a plurality of semiconductor light-emitting layers having different peak values of an emission wavelength; and
   a second semiconductor multi-layered mirror of a second conductivity type that is formed on the gate layer.

2. The light-emitting thyristor according to claim 1, wherein one of the semiconductor layers of the gate layer has a band gap larger than band gaps of other ones of the plurality of semiconductor light-emitting layers.

3. The light-emitting thyristor according to claim 2, wherein the gate layer includes a semiconductor layer having a band gap larger than the band gaps of the plurality of semiconductor light-emitting layers between the first semiconductor multi-layered mirror and the gate layer and between the second semiconductor multi-layered mirror and the gate layer.

4. A light source head comprising a plurality of the light-emitting thyristors according to claim 1.

5. The light source head according to claim 4, wherein one of the semiconductor layers of the gate layer has a band gap larger than band gaps of other ones of the plurality of semiconductor light-emitting layers.

6. The light source head according to claim 4, wherein the gate layer includes a semiconductor layer having a band gap larger than the band gaps of the plurality of semiconductor light-emitting layers between the first semiconductor multi-layered mirror and the gate layer and between the second semiconductor multi-layered mirror and the gate layer.

7. An image forming apparatus comprising:
   a photosensitive member;
   a charging unit that charges a surface of the photosensitive member;
   an exposing unit that includes a light source head according to claim 4 and that exposes the surface of the photosensitive member charged by the charging unit to light emitted from the light source head so as to form an electrostatic latent image on the surface of the photosensitive member;

a developing unit that develops the electrostatic latent image formed by the exposing unit; and a fixing unit that fixes the electrostatic latent image developed by the developing unit onto a recording medium.

8. The image forming apparatus according to claim 7, wherein one of the semiconductor layers of the gate layer has a band gap larger than band gaps of other one of the plurality of semiconductor light-emitting layers.

9. The image forming apparatus according to claim 7, wherein the gate layer includes a semiconductor layer having a band gap larger than the band gaps of the plurality of semiconductor light-emitting layers between the first semiconductor multi-layered mirror and the gate layer and between the second semiconductor multi-layered mirror and the gate layer.

* * * * *